United States Patent
Sood et al.

(10) Patent No.: US 9,184,666 B2
(45) Date of Patent: Nov. 10, 2015

(54) ACTIVE THERMAL PROTECTION FOR SWITCHES

(71) Applicant: Cirrus Logic, Inc., Austin, TX (US)

(72) Inventors: Mohit Sood, Austin, TX (US); Spencer Isaacson, Austin, TX (US); Rahul Singh, Austin, TX (US); Zhaohui He, Austin, TX (US)

( * ) Notice: Subject to any disclaimer, the term of this patent is extended or adjusted under 35 U.S.C. 154(b) by 351 days.

(21) Appl. No.: 13/833,587

(22) Filed: Mar. 15, 2013

(65) Prior Publication Data

US 2014/0028213 A1  Jan. 30, 2014

Related U.S. Application Data

(60) Provisional application No. 61/675,399, filed on Jul. 25, 2012.

(51) Int. Cl.
*H05B 37/02* (2006.01)
*H05B 39/04* (2006.01)
*H05B 41/36* (2006.01)
(Continued)

(52) U.S. Cl.
CPC ......... *H02M 3/33523* (2013.01); *H03K 17/145* (2013.01); *H05B 33/0815* (2013.01); *H05B 33/0848* (2013.01); *H05B 33/0884* (2013.01); *Y02B 20/341* (2013.01); *Y10T 307/406* (2015.04); *Y10T 307/832* (2015.04)

(58) Field of Classification Search
USPC ................................................. 315/210, 312
See application file for complete search history.

(56) References Cited

U.S. PATENT DOCUMENTS

| 5,963,023 A | 10/1999 | Herrell et al. |
| 6,343,022 B1 | 1/2002 | Naruse |

(Continued)

FOREIGN PATENT DOCUMENTS

| CN | 101193474 A | 6/2008 |
| CN | 101790269 A | 7/2010 |

(Continued)

OTHER PUBLICATIONS

International Search Report, PCT/US2013/051892, European Patent Office, Feb. 25, 2014, pp. 1-4.

(Continued)

*Primary Examiner* — Adam Houston
(74) *Attorney, Agent, or Firm* — Terrile, Cannati, Chambers & Holland, LLP; Kent B. Chambers

(57) ABSTRACT

A system and method include a controller that reduces power dissipated by a switch, such as a source-controlled field effect transistor, when an estimated amount of power dissipated by the switch exceeds a predetermined threshold. Reducing the power dissipated by the switch prevents damage to the switch due to overheating. The controller determines the estimated amount of power dissipated by the switch using actual drain-to-source current and drain voltage data. In at least one embodiment, the controller includes a fail-safe, estimated power dissipation determination path that activates when the drain voltage data fails a reliability test. Additionally, in at least one embodiment, the controller includes a model of thermal characteristics of the switch. In at least one embodiment, the controller utilizes real-time estimated power dissipation by the switch and the model to determine when the estimated power dissipated by the switch exceeds a power dissipation protection threshold.

47 Claims, 9 Drawing Sheets

(51) Int. Cl.
*H02M 3/335* (2006.01)
*H03K 17/14* (2006.01)
*H05B 33/08* (2006.01)

(56) References Cited

U.S. PATENT DOCUMENTS

| | | | |
|---|---|---|---|
| 6,621,256 | B2 | 9/2003 | Muratov et al. |
| 6,819,538 | B2 | 11/2004 | Blaauw et al. |
| 7,538,499 | B2 | 5/2009 | Ashdown |
| 7,561,394 | B2 | 7/2009 | Mulligan et al. |
| 7,786,711 | B2 | 8/2010 | Wei et al. |
| 7,834,828 | B2 | 11/2010 | Arakawa et al. |
| 7,969,430 | B2 | 6/2011 | Korcharz et al. |
| 2004/0105283 | A1 | 6/2004 | Schie et al. |
| 2004/0164685 | A1 | 8/2004 | Dygert |
| 2006/0208669 | A1 | 9/2006 | Huynh et al. |
| 2006/0214603 | A1 | 9/2006 | Oh et al. |
| 2007/0152734 | A1* | 7/2007 | Senthinathan et al. ....... 327/530 |
| 2007/0182338 | A1 | 8/2007 | Shteynberg et al. |
| 2007/0236155 | A1 | 10/2007 | Kao et al. |
| 2008/0030143 | A1 | 2/2008 | Goriki et al. |
| 2008/0037303 | A1 | 2/2008 | Mishimagi |
| 2008/0143266 | A1 | 6/2008 | Langer |
| 2009/0195186 | A1 | 8/2009 | Guest et al. |
| 2010/0013409 | A1 | 1/2010 | Quek et al. |
| 2010/0033146 | A1* | 2/2010 | Irissou et al. ................. 323/282 |
| 2010/0066328 | A1 | 3/2010 | Shimizu et al. |
| 2010/0156319 | A1* | 6/2010 | Melanson .................... 315/297 |
| 2010/0164406 | A1 | 7/2010 | Kost et al. |
| 2011/0002069 | A1 | 1/2011 | Yamano et al. |
| 2011/0109230 | A1 | 5/2011 | Simi |
| 2011/0181199 | A1 | 7/2011 | Lin et al. |
| 2011/0204797 | A1 | 8/2011 | Lin et al. |
| 2011/0241557 | A1 | 10/2011 | Grotkowski et al. |
| 2011/0298374 | A1 | 12/2011 | Lenk et al. |
| 2012/0068626 | A1 | 3/2012 | Lekatsas et al. |
| 2012/0104858 | A1 | 5/2012 | Noe |
| 2012/0112638 | A1* | 5/2012 | Melanson et al. ............ 315/117 |
| 2012/0112639 | A1 | 5/2012 | Melanson et al. |
| 2012/0112665 | A1 | 5/2012 | Melanson et al. |
| 2012/0133025 | A1* | 5/2012 | Clarke et al. ................. 257/570 |
| 2012/0181946 | A1* | 7/2012 | Melanson ..................... 315/247 |
| 2012/0286684 | A1 | 11/2012 | Melanson et al. |
| 2014/0028213 | A1* | 1/2014 | Sood et al. .................... 315/210 |
| 2014/0252975 | A1* | 9/2014 | Drakshapalli et al. ........ 315/210 |
| 2014/0265916 | A1* | 9/2014 | Melanson et al. ............ 315/291 |
| 2015/0028764 | A1* | 1/2015 | Maru et al. .................... 315/210 |
| 2015/0028768 | A1* | 1/2015 | Melanson et al. ............ 315/294 |
| 2015/0113310 | A1* | 4/2015 | Mistry et al. ................. 713/340 |

FOREIGN PATENT DOCUMENTS

| | | |
|---|---|---|
| JP | 2009170240 A | 7/2009 |
| WO | 9917591 | 4/1999 |
| WO | 02096162 A1 | 11/2002 |
| WO | 2008004009 A2 | 1/2008 |
| WO | 2010011971 A1 | 3/2010 |

OTHER PUBLICATIONS

Written Opinion, PCT/US 2013/051892, European Patent Office, Feb. 25, 2014, pp. 1-6.

* cited by examiner

ACTIVE THERMAL PROTECTION FOR SWITCHES

CROSS-REFERENCE TO RELATED APPLICATION

This application claims the benefit under 35 U.S.C. §119 (e) and 37 C.F.R. §1.78 of U.S. Provisional Application No. 61/675,399 filed on Jul. 25, 2012, which is incorporated by reference in its entirety.

BACKGROUND OF THE INVENTION

1. Field of the Invention

The present invention relates in general to the field of electronics, and more specifically to a system and method that provides thermal protection for switches.

2. Description of the Related Art

Switching power converters convert power received from a power source, such as a voltage supply, into power suitable for a load. The power received from the voltage supply is referred to as "POWER IN", and the power provided to the load is referred to as "POWER OUT". All switching power converters have some inherent power losses due to, for example, non-ideal component characteristics. Such inherent power losses tend to be minimized so as to increase the efficiency of the switching power converters. Inherent power losses are represented herein by "$P_{INH}$". In some contexts, the amount of power supplied to the switching power converter can exceed the amount of power provided by the switching power converter to a load, i.e. POWER IN>POWER OUT+$P_{INH}$. When the POWER IN is greater than the POWER OUT+$P_{INH}$, the switching power converter passively dissipates the excess energy using passive resistors.

A dimmable lighting system that includes a low power lamp, such as one or more light emitting diodes (LEDs), represents one context when the POWER IN to the switching power converter can be greater than the POWER OUT $P_{INH}$ of the switching power converter. In this exemplary context, the switching power converter receives current through a triode for alternating current ("triac") based dimmer. Once a triac-based dimmer begins conducting during a cycle of an alternating current ("AC") supply voltage to prevent the triac from disadvantageously, prematurely disconnecting during mid-cycle of the supply voltage, the switching power converter draws a minimum current referred to as a "hold current". As long as an input current to the switching power converter is greater than or equal to the hold current, the triac-based dimmer should not prematurely disconnect. For a leading edge dimmer, a premature disconnect occurs when the dimmer begins conducting and stops conducting prior to reaching a zero crossing of the supply voltage. Premature disconnects can cause problems with the lighting system, such as flicker and instability.

Thus, to prevent premature disconnection of the triac-based dimmer, the minimum POWER IN to the switching power converter equals the hold current ("$i_{HOLD}$") times an input voltage "$V_{IN}$" to the switching power converter. Conventional triac-based dimmers were designed to provide power to incandescent light bulbs. For desired dimming levels, an incandescent light bulb generally draws a current at least equal to the hold current for all usable dimming levels. However, other lamps, such as LEDs are more efficient than incandescent light bulbs in terms of power versus light output and, thus, provide equivalent light output while using less power than an incandescent light bulb. Thus, lighting systems with LEDs typically utilize less power and less current than incandescent bulbs. To balance the power when the lighting system draws more POWER IN than the lighting system inherently dissipates and provides as POWER OUT to the lamp, the lighting system utilizes one or more passive resistors to internally dissipate excess power.

FIG. 1 depicts a lighting system 100 that includes a leading edge, phase-cut dimmer 102. FIG. 2 depicts ideal, exemplary voltage graphs 200 associated with the lighting system 100. Referring to FIGS. 1 and 2, the lighting system 100 receives an AC supply voltage $V_{IN}$ from voltage supply 104. The supply voltage $V_{IN}$, indicated by voltage waveform 202, is, for example, a nominally 60 Hz/110 V line voltage in the United States of America or a nominally 50 Hz/220 V line voltage in Europe. A leading edge dimmer 102 phase cuts leading edges, such as leading edges 204 and 206, of each half cycle of supply voltage $V_{IN}$. Since each half cycle of supply voltage $V_{IN}$ is 180 degrees of the input supply voltage $V_{IN}$, the leading edge dimmer 102 phase cuts the supply voltage $V_{IN}$ at an angle greater than 0 degrees and less than 180 degrees. Generally, the voltage phase cutting range of a leading edge dimmer 102 is 10 degrees to 170 degrees. "Phase cutting" the supply voltage refers to modulating a leading edge phase angle of each cycle of an alternating current ("AC") supply voltage. "Phase cutting" of the supply voltage is also commonly referred to as "chopping". Phase cutting the supply voltage reduces the average power supplied to a load, such as a lighting system, and thereby controls the energy provided to the load.

The input signal voltage $V_{\Phi\_IN}$ to the lighting system 100 represents a dimming level that causes the lighting system 100 to adjust power delivered to a lamp 122, and, thus, depending on the dimming level, increase or decrease the brightness of the lamp 122. Many different types of dimmers exist. In general, dimmers use a digital or analog coded dimming signal that indicates a desired dimming level. For example, the triac-based dimmer 102 phase cuts a leading edge of the AC input supply voltage $V_{IN}$. The leading edge dimmer 102 can be any type of leading edge dimmer, such as a triac-based leading edge dimmer available from Lutron Electronics, Inc. of Coopersberg, Pa. ("Lutron"). A triac-based leading edge dimmer is described in the Background section of U.S. patent application Ser. No. 12/858,164, entitled Dimmer Output Emulation, filed on Aug. 17, 2010, and inventor John L. Melanson.

The phase cut dimmer 102 supplies the input voltage $V_{\Phi\_IN}$ as modified by the phase cut dimmer 102 to a full bridge diode rectifier 106. The full bridge rectifier 106 supplies an AC rectified voltage $V_{\Phi R\_IN}$ to the switching power converter 108. Capacitor 111 filters high frequency components from rectified voltage $V_{\Phi R\_IN}$. To control the operation of switching power converter 108, controller 110 generates a control signal $CS_0$ to control conductivity of field effect transistor (FET) switch 112. The control signal $CS_0$ is a pulse width modulated signal. Control signal $CS_0$ waveform 114 represents an exemplary control signal $CS_0$. The controller 110 generates the control signal $CS_0$ with two states as shown in the waveform 114. Each pulse of control signal $CS_0$ turns switch 112 ON (i.e. conducts) represents a first state that causes the switch 112 to operate efficiently and minimize power dissipation by the switch 112. During each pulse of control signal $CS_0$, the inductor current $i_L$ increases, as shown in the exemplary inductor current waveform 115, to charge inductor 116 during a charging phase $T_C$. Diode 118 prevents current flow from link capacitor 120 into switch 112. When the pulse of control signals $CS_0$ ends, the control signal $CS_0$ is in a second state, and the inductor 116 reverses voltage polarity (commonly referred to as "flyback"). The inductor current $i_L$ decreases during the flyback phase $T_{FB}$, as shown in inductor current waveform 115. The inductor current $i_L$ boosts the link voltage across the link capacitor 120 through diode 118. When the flyback phase $T_{FB}$ ends and when the next charging phase $T_C$ begins depends on the operating mode of the switching power converter. In discontinuous conduction mode (DCM), the flyback phase $T_{FB}$ ends before the next charging phase $T_C$ begins. However, regardless of whether the switching power converter 108 operates in discontinuous conduction mode, continuous conduction mode, or critical conduction mode, the flyback phase $T_{FB}$ begins as soon as the charging phase $T_C$ ends.

The switching power converter 108 is a boost-type converter, and, thus, the link voltage $V_{LINK}$ is greater than the rectified input voltage $V_{\Phi R\_IN}$. Controller 110 senses the rectified input voltage $V_{\Phi R\_IN}$ at node 124 and senses the link voltage $V_{LINK}$ at node 126. Controller 110 operates the switching power converter 108 to maintain an approximately constant link voltage $V_{LINK}$ for lamp 122, provide power factor correction, and correlate the link current $i_{LINK}$ with the phase cut angle of the rectified input voltage $V_{\Phi R\_IN}$. Lamp 132 includes one or more light emitting diodes.

To decrease the light output of the lamp 122, the phase cut dimmer 102 increases the phase cut angle of the rectified input voltage $V_{\Phi R\_IN}$, i.e. time $T_{OFF}$ increases and time $T_{ON}$ decreases. The controller 110 responds to the increased phase cut angle by decreasing the current $i_{LNK}$ provided to the lamp 122, which decreases the light output of the lamp 122.

The switching power converter 108 includes a power dissipation resistor 128 so that the dimmer current $i_{DIM}$ does not fall below the hold current value and prematurely disconnect during a cycle of the rectified input voltage $V_{\Phi R\_IN}$. The "POWER IN" supplied to the switching power converter 108 equals $V_{\Phi\_IN} \cdot i_{DIM}$. The "POWER OUT" supplied by switching power converter 108 equals $V_{LINK} \cdot i_{LINK}$. Because of the relatively low power requirements of an LED based lamp 122, particularly at low light output levels, if the POWER IN equals the POWER OUT+$P_{INH}$, the dimmer current $i_{DIM}$ may fall below the hold current value and cause the phase-cut dimmer 102 to prematurely disconnect. In this situation, to prevent the dimmer current $i_{DIM}$ from falling below the hold current value, the controller 110 causes the switching power converter 108 to maintain the dimmer current $i_{DIM}$ above the hold current value, which causes the POWER IN to be greater than the POWER OUT+$P_{INH}$. Since the POWER IN is greater than the POWER OUT+$P_{INH}$, the switching power converter 108 dissipates the excess power through power dissipation resistor 128.

Because of component non-idealities, the switching power converter 108 includes inherent power losses. Inherent power losses include conductor resistances and switching losses in switch 112. However, circuits are generally designed to minimize inherent power losses, and these inherent power losses are often negligible and, thus, insufficient to dissipate enough power to compensate for the difference between the POWER IN and the POWER OUT+$P_{INH}$ at some POWER OUT levels. To increase the power loss of switching power converter so that the dimmer current $i_{DIM}$ remains above a hold current value even at lower power demand by the lamp 122, switching power converter 108 includes the resistor 128 to create a passive power loss when switch 112 conducts the inductor current $i_L$. For negligible inherent power losses, the resistance value of the resistor 128 is selected so that when the switching power converter is providing a minimum link current $i_{LINK}$, the POWER IN=POWER OUT+$P_{INH}$+PASSIVE POWER DISSIPATE.

Resistor 128 is relatively inexpensive to implement as part of switching power converter 108. However, when the link current $i_{LINK}$ is sufficiently high such that POWER IN equals POWER OUT+$P_{INH}$, the dimmer input current $i_{DIM}$ could be maintained above the hold current value without dissipating power through resistor 128. However, since the dimmer input current $i_{DIM}$ always flows through the resistor 128 when the switch 108 conducts, the resistor 128 still passively dissipates power regardless of whether the POWER IN is equal to the POWER OUT+$P_{INH}$, which decreases the efficiency of lighting system 100.

SUMMARY OF THE INVENTION

In one embodiment of the present invention, a method includes controlling conductivity of a switch and estimating an amount of power dissipated by the switch. The method further includes determining if the estimated power dissipated by the switch exceeds a first predetermined threshold value and reducing the power dissipated by the switch when the estimated power dissipated by the switch exceeds the first predetermined threshold value.

In another embodiment of the present invention, an apparatus includes a controller, and the controller is configured to control conductivity of a switch and estimate an amount of power dissipated by the switch. The controller is further configured to determine if the estimated power dissipated by the switch exceeds a first predetermined threshold value and reduce the power dissipated by the switch when the estimated power dissipated by the switch exceeds the first predetermined threshold value.

In a further embodiment of the present invention, an apparatus includes a switching power converter having a switch whose conductivity controls power conversion by the switching power converter. The apparatus further includes a load coupled to the switching power converter and a controller. The controller is configured to control conductivity of a switch and estimate an amount of power dissipated by the switch. The controller is further configured to determine if the estimated power dissipated by the switch exceeds a first predetermined threshold value and reduce the power dissipated by the switch when the estimated power dissipated by the switch exceeds the first predetermined threshold value.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A system and method include a controller that reduces power dissipated by a switch when an estimated amount of power dissipated by the switch exceeds a predetermined threshold. In at least one embodiment, reducing the power dissipated by the switch prevents damage to the switch due to thermal effects of overheating. In at least one embodiment, the controller determines the estimated amount of power dissipated by the switch using actual drain-to-source current and drain voltage data. In at least one embodiment, the controller includes a fail-safe, estimated power dissipation determination path that activates when the drain voltage data fails a reliability test.

Additionally, in at least one embodiment, the controller includes a model of thermal characteristics of the switch. In at least one embodiment, the controller utilizes real-time estimated power dissipation by the switch and the model to determine when the estimated power dissipated by the switch exceeds a power dissipation protection threshold. When the estimated power dissipated by the switch exceeds the power dissipation protection threshold, the controller reduces power to the switch to, for example, prevent thermal damage to the switch. In at least one embodiment, the controller restores normal operation of the switch when either the modeled, estimate power dissipation of the switch is less than a power dissipation recovery threshold, or a system controlled by the switch is restarted. In at least one embodiment, one or more particular threshold values and one or more values for the model are programmable based on known circuit characteristics of the switch and input voltage values to circuitry controlled by the switch.

The particular type of switch and type of switch control is a matter of design choice. In at least one embodiment, the switch is a field effect transistor (FET) that is source-controlled or gate controlled. In other embodiments, the switch is a bipolar junction transistor. The following discussion begins with an application of switch protection within the context of a source-controlled FET.

Figure 3:
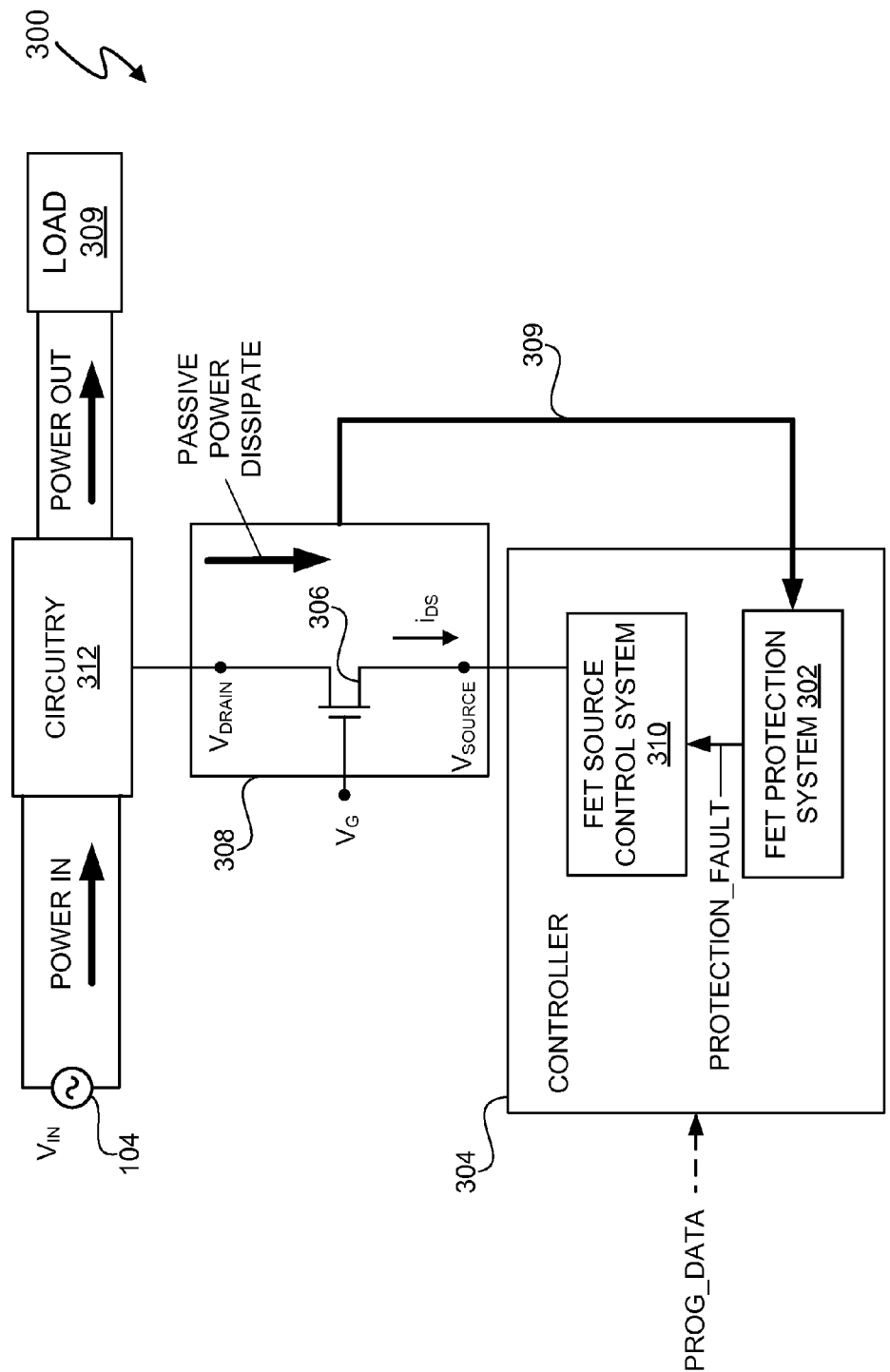
FIG. 3 depicts an electronic system that includes a FET protection system.

FIG. 3 depicts an electronic system 300 that includes a FET protection system 302 as part of the controller 304. The FET protection system 302 reduces power dissipated by a source-controlled FET 306 when an estimated amount of power dissipated by the FET 306 exceeds a predetermined threshold. In some instances and in at least one embodiment, the power into the circuitry 312 from voltage source 104 is greater than the power out of the circuitry 312 to the load 309 plus the inherent power losses of the FET 306. Thus, in at least one embodiment, the FET source control system 310 controls the FET 306 to dissipate the excess power. Dissipating excess power increases heat generation in the FET 306, and the increased heat generation can damage of the FET 306 if the power dissipated exceeds the thermal design limits of the FET 306. The load 309 can be any type of load, such as one or more light emitting diodes (LEDs).

To determine the estimated power dissipated by the FET 306, the electronic system 300 includes a power sensing system 308 that senses operating parameters of the FET 306 that are related to power dissipation by the FET 306 and provides the parameters to the FET protection system 302 via parameter sensing path 309. When the estimated power dissipated by the FET 306 exceeds the power dissipation protection threshold, the FET protection system 302 provides a PROTECTION_FAULT signal to the FET source-control system 310, and the FET source-control system 310 reduces power to the FET 306. In at least one embodiment, the power reduction to the FET 306 prevents thermal damage to the FET. In at least one embodiment, the controller determines the estimated amount of power dissipated by the FET using actual drain-to-source current $i_{DS}$ and drain voltage $V_{DRAIN}$ data. As subsequently described in more detail, in at least one embodiment, the FET protection system 302 includes a redundant estimated power dissipation determination path (not shown) that activates when the drain voltage $V_{DRAIN}$ data fails a reliability test.

Additionally, in at least one embodiment and as subsequently described in more detail, the FET protection system 302 includes a model (not shown) of thermal characteristics of the FET 306. In at least one embodiment, the FET protection system 302 utilizes real-time estimated power dissipation by the FET 306 and the model to determine when the estimated power dissipated by the FET 306 exceeds a power dissipation protection threshold. When the estimated power dissipated by the FET 306 exceeds the power dissipation protection threshold, the FET protection system 302 reduces power to the FET 306 to, for example, prevent thermal damage to the FET 306. In at least one embodiment, the FET protection system 302 restores normal operation of the FET when either the modeled, estimate power dissipation of the FET 306 is less than a power dissipation recovery threshold, or the circuitry 312 controlled by the FET 306 is restarted. In at least one embodiment, one or more particular threshold values and one or more values for the model are optionally programmable based on known circuit characteristics of the FET 306 and maximum values of the drain voltage $V_{DRAIN}$. The particular circuitry 312 is a matter of design choice. In at least one embodiment, the circuitry 312 includes a switching power converter, and the FET source control system 310 controls the circuitry as illustratively described in U.S. patent application Ser. No. 13/289,845, entitled "Controlled Power Dissipation in a Switch Path in a Lighting System", filed Nov. 4, 2011, and inventors John L. Melanson and Eric J. King, which is incorporated by reference in its entirety. The particular implementation of controller 304 is a matter of design choice. For example, controller 304 can be (i) implemented as an integrated circuit including, for example, a processor to execute software or firmware instructions stored in a memory, (ii) implemented using discrete components, or (iii) implemented using any combination of the foregoing. Additionally, in at least one embodiment, all of the components in electronic system 300, except the voltage supply 104 are included in a lamp.

Figure 4:
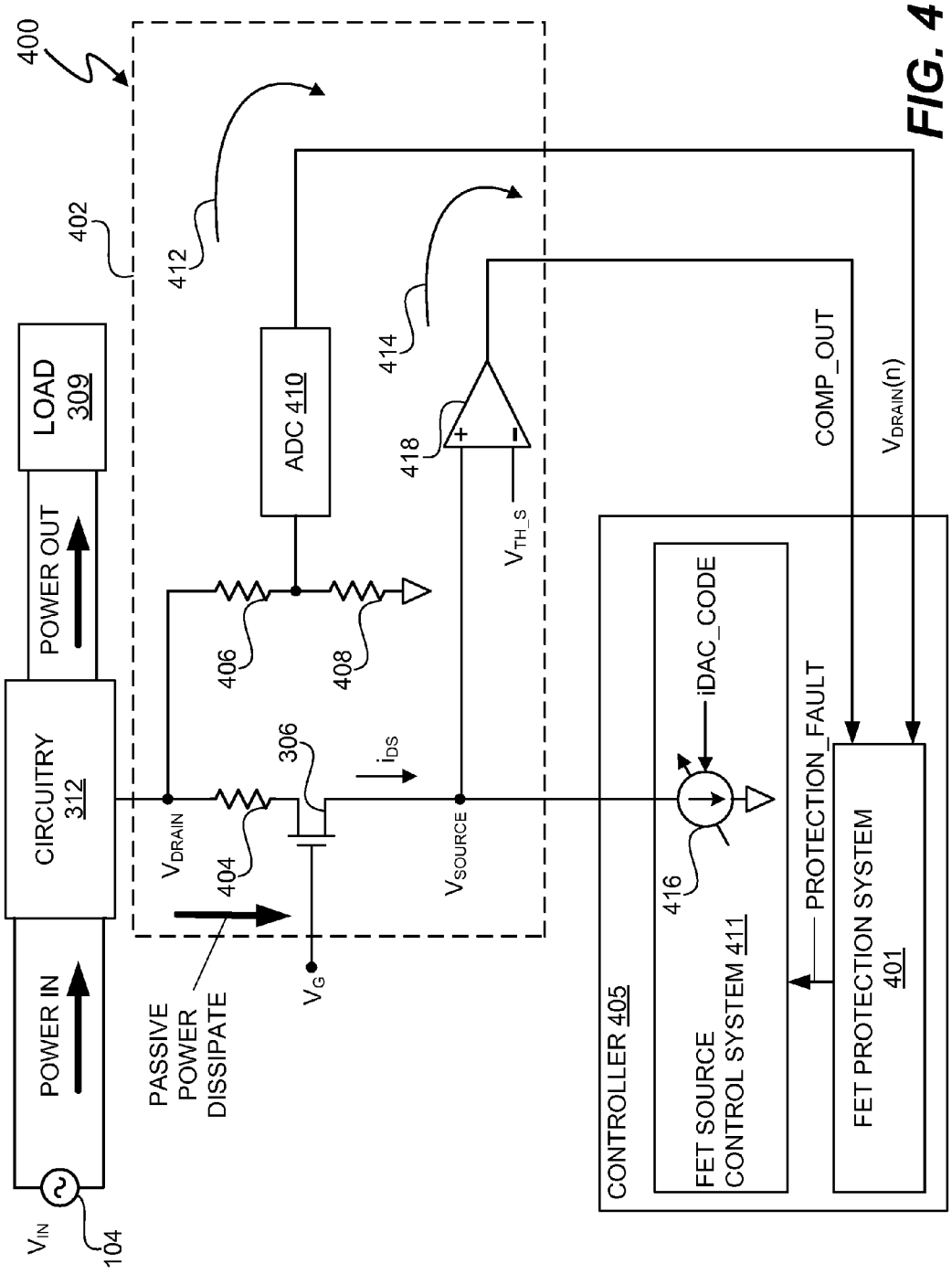
FIG. 4 depicts an embodiment of the electronic system of FIG. 3.

FIG. 4 depicts electronic system 400, which represents one embodiment of electronic system 300. Electronic system 400 includes power sensing system 402, which represents one embodiment of the power sensing system 308. The controller 405 represents one embodiment of the controller 304, the FET protection system 401 represents one embodiment of the FET protection system 302, and the FET source control system 411 represents one embodiment of the FET source control system 310. The FET source control system 411 controls the drain-to-source current $i_{DS}$ through the FET 306 by generating a current control signal iDAC_CODE to control the variable current source 416. A controllable source current generator 403 responds to the current control signal iDAC_CODE by generating a drain-to-source current $i_{DS}$ corresponding to the current control signal iDAC_CODE. Thus, the current control signal iDAC_CODE represents the drain-to-source current $i_{DS}$. The power sensing system 402 includes a drain resistor 404 that provides some passive heat dissipation. However, the resistance of the drain resistor 404 is minimized to reduce power losses. The particular location in electronic system 400 for sampling the drain voltage $V_{DRAIN}$ is a matter of design choice. In the embodiment of FIG. 4, the drain voltage $V_{DRAIN}$ is sampled between the circuitry 312 and the drain resistor 404. When the drain voltage is sampled between the circuitry 312 and the drain resistor 404, in at least one embodiment, the estimated power dissipated by the FET 306 includes power dissipated by the drain resistor 404. In at least one embodiment (not shown), the drain voltage $V_{DRAIN}$ is sampled between the drain resistor 404 and the FET 306, and the estimated power dissipated by the FET 306 does not include the power dissipated by the drain resistor 404. Thus, the particular place in which the drain voltage $V_{DRAIN}$ is sampled can affect the accuracy of the estimated power dissipated by the FET 306 but still represents an estimated power dissipated by the FET 306. In at least one embodiment, to compensate for the power dissipated by the drain resistor 404, the FET protection system 401 can include a model of the power dissipated by the drain resistor 404, can adjust the determined estimated power dissipated by the FET 306 by an estimate of the power dissipated by the drain resistor 404 to obtain a more accurate estimate of the power dissipated by the FET 306, or adjust a power protection threshold value to which the estimated power dissipated by the FET 306. The power protection threshold value is subsequently discussed.

Series connected resistors 406 and 408 and the analog-to-digital converter (ADC) 410 provide a primary path 412 for scaling and sampling the drain voltage $V_{DRAIN}$ to provide a scaled, digital, drain voltage sample $V_{DRAIN}(n)$ to the FET protection system 401, where "n" is an integer index reference to a particular sample. In at least one embodiment, the FET protection system 401 determines estimated power dissipation in accordance with Equation 1:

$$P_{EPD} = V \cdot i_{DS} \quad \text{Equation 1}$$

where $P_{EPD}$ is the estimated power dissipation of the FET 306, V is an estimated drain-to-source voltage of the FET 306, and $i_{DS}$ is the drain-to-source current value represented by the current control signal iDAC_CODE. In at least one embodiment, the drain voltage $V_{DRAIN}$ is the largest possible voltage drop across the drain to the source of the FET 306. Accordingly, utilizing the scaled, digital voltage sample $V_{DRAIN}(n)$ to determine the power dissipated by the FET 306 in accordance with Equation 1 provides a conservative estimate of the power dissipated by the FET 306. U.S. patent application Ser. No. 13/194,699, entitled "Dimmer Compatibility with Reactive Loads", filed on Jul. 29, 2011, inventors John L. Melanson, Eric J. King, Robert T. Grisamore, and Firas Azrai describe an exemplary variable current source 416. U.S. patent application Ser. No. 13/194,699 is hereby incorporated by reference in its entirety.

The electronic system 400 includes a fail-safe path 414 for detecting a failure in the primary path 412. The failure in the primary path 412 can occur for any number of reasons. For example, resistors 406 could open, resistor 408 could short, and/or rapid changes in the drain voltage $V_{DRAIN}$ could exceed the bandwidth of the ADC 410. The fail-safe path 414 includes a comparator 418 that compares the source voltage $V_{SOURCE}$ to a source threshold voltage $V_{TH\_S}$ and generates a binary output signal COMP_OUT that represents a comparison outcome. The particular value of the source threshold voltage $V_{TH\_S}$ is a matter of design choice and is, in at least one embodiment, any value within a range of 3-6 volts. As subsequently described in more detail, if the source voltage $V_{SOURCE}$ is greater than the source threshold voltage $V_{TH\_S}$ and the drain voltage sample $V_{DRAIN}(n)$ is less than a threshold voltage $V_{TH\_D}$ (shown in and subsequently discussed with FIG. 5), then the FET protection system 401 determines that the primary path 412 may have failed. As subsequently discussed in more detail, if the FET protection system 401 determines that the primary path 412 may have failed, the FET protection system 401 utilizes a fail-safe, estimated drain-to-source voltage in Equation 1 to determine an alternate estimated power dissipation of the FET 306 and utilizes the alternate estimated power dissipation of the FET 306 to determine whether to reduce power dissipation by the FET 306.

As subsequently described in more detail, the FET protection system 401 compares the estimated power dissipation $P_{EPD}$ of the FET 306 to a power protection threshold value. If the estimated power dissipation $P_{EPD}$ of the FET 306 is greater than the power protection threshold value, then the FET protection system 401 generates a fault value of the PROTECTION_FAULT signal that indicates that the power dissipation of the FET 306 exceeds a predetermined limit. Upon receiving the fault value of the PROTECTION_FAULT signal, the FET source control system 411 generates the IDAC_CODE signal to reduce the drain-to-source current $i_{DS}$ in the FET 306 and, thus, reduce the power dissipation by the FET 306. In at least one embodiment, the FET source control system 411 generates the IDAC_CODE signal to stop the drain-to-source current $i_{DS}$ in the FET 306 until the FET protection system 401 determines that the FET 306 has sufficiently cooled to restore operation of the FET 306 without damaging the FET 306. The value of the power protection threshold value is a matter of design choice and, in at least one embodiment, is a maximum power dissipation value or percentage of the maximum power dissipation value of the FET 306 obtained by a manufacturer's data sheet for the FET 306.

Figure 5:
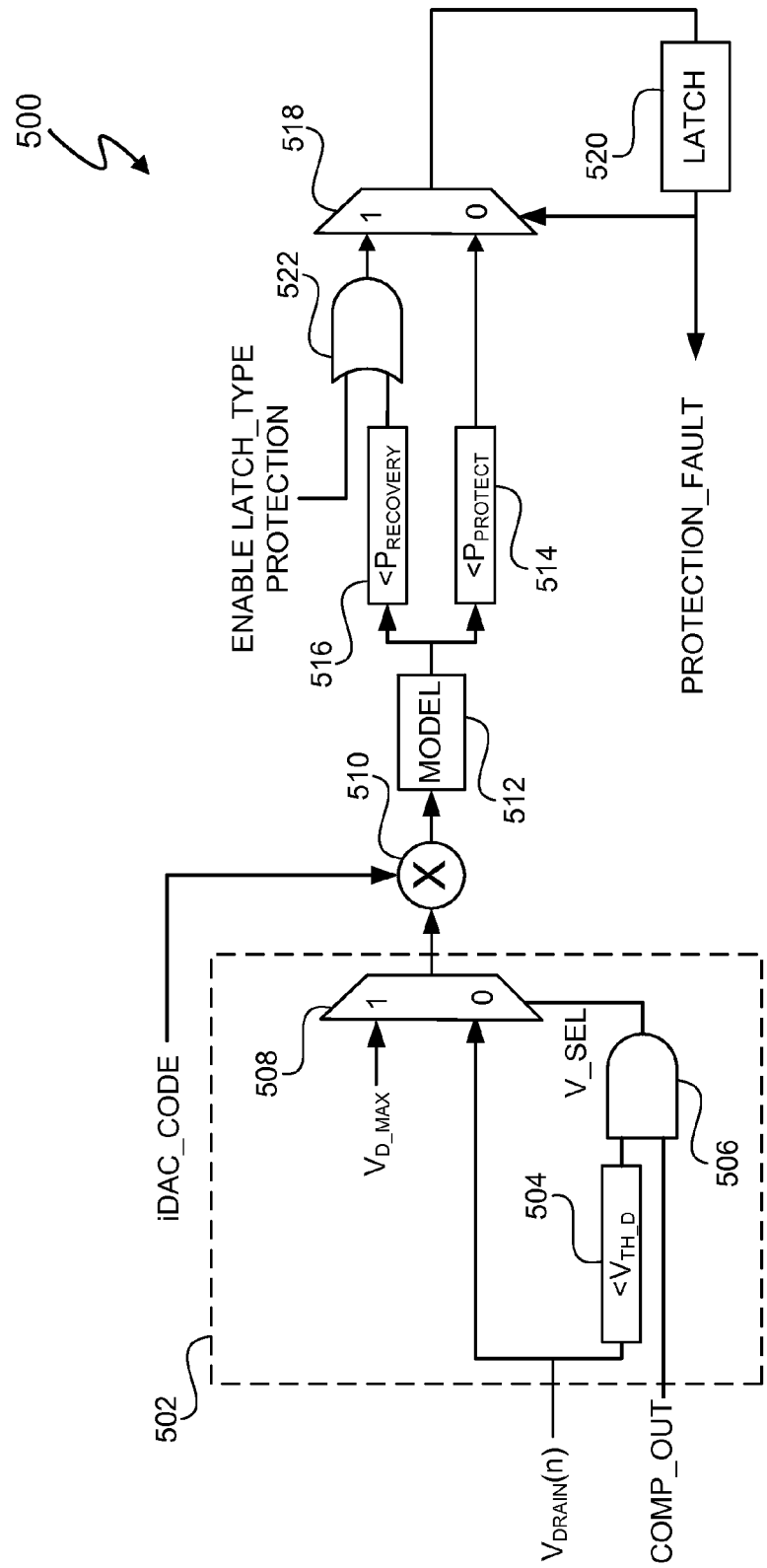
FIG. 5 depicts an embodiment of a FET protection system.

FIG. 5 depicts FET protection system 500, which represents one embodiment of the FET protection system 401. The FET protection system 500 determines when to reduce power dissipation of the FET 306 to prevent damage to the FET 306 due to, for example, overheating. The primary/fail-safe logic 502 determines when to use the sampled drain voltage value $V_{DRAIN}(n)$ and when to use a fail-safe drain voltage value $V_{D\_MAX}$. The primary/fail-safe logic 502 includes comparison logic 504 to determine if the sampled drain voltage value $V_{DRAIN}(n)$ is less than drain threshold value $V_{TH\_D}$. In at least one embodiment, the threshold value $V_{TH\_D}$ is set to a value that is low enough so that if the sampled drain voltage value $V_{DRAIN}(n)$ is accurate, then the sampled drain voltage value $V_{DRAIN}(n)$ will be greater than the threshold value $V_{TH\_D}$. The particular value of the threshold value $V_{TH\_D}$ is a matter of design choice, and, in at least one embodiment, the threshold value $V_{TH\_D}$ is set to approximately 15% of an expected peak value of the drain voltage $V_{DRAIN}$. In at least one embodiment, approximately 15% of an expected worst case peak value of the drain voltage $V_{DRAIN}$ is 30V for a nominal 110V root mean square (RMS) voltage source 104 and 60V for a nominal 220V RMS voltage source 104.

Referring to FIGS. 4 and 5, the primary/fail-safe logic 502 also includes a logic AND gate 506 to logically AND the COMP_OUT signal from comparator 418 with the output value of the comparison logic 504. A logical 0 value of the COMP_OUT signal indicates that the source voltage $V_{SOURCE}$ of the FET 306 is less than the source threshold value $V_{TH\_S}$. If the source voltage $V_{SOURCE}$ of the FET 306 is less than the source threshold value $V_{TH\_S}$ or the sampled drain voltage value $V_{DRAIN}(n)$ is greater than the drain threshold value $V_{TH\_D}$, then the voltage select output V_SEL of the AND gate 506 is a logical zero, which indicates that the sampled drain voltage value $V_{DRAIN}(n)$ should be accurate. If the source voltage $V_{SOURCE}$ of the FET 306 is greater than the source threshold value $V_{TH\_S}$, then the sampled drain voltage value $V_{DRAIN}(n)$ should be greater than the drain threshold value $V_{TH\_D}$. However, a source voltage $V_{SOURCE}$ of the FET 306 is greater than the source threshold value $V_{TH\_S}$ and a sampled drain voltage value $V_{DRAIN}(n)$ is less than the drain threshold value $V_{TH\_D}$ indicates a failure of the primary path 412, and both inputs to the logic AND gate 506 are a logical one, which results in a logical one output, select signal V_SEL of the logic AND gate 506.

The select signal V_SEL of the logic AND gate 506 functions as a select signal for the 2-to-1 multiplexer 508. As previously indicated, when the primary/fail-safe logic 502 determines that the sampled drain voltage value $V_{DRAIN}(n)$ from the primary path 412 is accurate, the select signal V_SEL is a logical zero and selects the sampled drain voltage value $V_{DRAIN}(n)$ as the output of the multiplexer 508. When the primary/fail-safe logic 502 determines that the sampled drain voltage value $V_{DRAIN}(n)$ from the primary path 412 is inaccurate, the select signal V_SEL is a logical one and selects the maximum drain voltage $V_{D\_MAX}$ as the output of the multiplexer 508. The maximum drain voltage $V_{D\_MAX}$ represents a worst case voltage value for power dissipation by the FET 306. In accordance with Equation 1, the multiplier 510 multiples the output of the multiplexer 508 times the current control signal iDAC_CODE to determine an instantaneous estimated power dissipated by the FET 306.

Since the temperature of the FET 306 does not change to a maximum, non-damaging limit or cool to a safe limit instantaneously, when the instantaneous power dissipated by the FET 306 exceeds a predetermined power protection threshold value, the FET 306 may not have yet reached a thermal limit that can damage the FET 306. Likewise, when the instantaneous power dissipated by the FET 306 decreases below a predetermined power recovery threshold value, the FET 306 may not have yet reached a temperature that indicates the FET 306 can safely resume operation. Thus, in at least one embodiment, primary/fail-safe logic 502 includes a model 512 that models the thermal change characteristics of the FET 306. In at least one embodiment, the model 512 is a low-pass filter having a time constant that models the thermal change characteristics of the FET 306 so that the output of the multiplier 510 is averaged over time, thus, dampening the changes in instantaneous power dissipation of the FET 306. The particular time constant of the model 512 is a matter of design choice and preferably directly corresponds to the thermal change characteristics of the FET 306. In at least one embodiment, the time constant is programmable and, for example, ranges from 0.5-32 seconds. The particular type of filter is also a matter of design choice and, in at least one embodiment, is a digital infinite impulse response filter.

The primary/fail-safe logic 502 utilizes two power dissipation thresholds that provide hysteresis control to determine when to activate the PROTECTION_FAULT signal and thereby cause the FET source control system 411 to reduce power dissipated by the FET 306. The output of the model 512 is compared to two power dissipation threshold values, i.e. a power protection threshold $P_{PROTECT}$ and a power recovery threshold $P_{RECOVERY}$, by respective comparator logic 514 and 516. If the comparator logic 514 determines that the modeled, estimated power dissipation of the FET 306 is greater than the power protection threshold $P_{PROTECT}$ threshold, then the output of the comparator logic 514 is a logical 1 and otherwise is a logical 0. If the comparator logic 516 determines that the modeled, estimated power dissipation of the FET 306 is greater than the power recovery threshold $P_{RECOVERY}$ threshold, then the output of the comparator logic 516 is a logical 1 and otherwise is a logical 0. The initial values of the PROTECTION_FAULT signal and the outputs of the comparator logic 514 and 516 are all logical 0, which indicates a lack of an excessive power dissipation/over temperature fault condition of FET 306.

Because of the initial conditions, as long as the modeled, estimated power dissipation of the FET 306 is below the power protection threshold $P_{PROTECT}$, the PROTECTION_FAULT signal remains a logical 0 and the multiplexer 518 selects the logical 0 output of the comparator logic 514. The latch 520 holds the output of the multiplexer 518 as the value of the PROTECTION_FAULT signal. The latch 520 can be any type of memory, such as a D-flip flop. If the modeled, estimated power dissipation of the FET 306 at the output of the model 512 rises above the power protection threshold $P_{PROTECT}$, then the power dissipation of the FET 306 represents a temperature that exceeds a maximum safe operating temperature of the FET 306. The output of the comparator logic 514 then transitions from a logical 0 to a logical 1, and the value of the PROTECTION_FAULT signal transitions and is latched to a logical 1. When the value of the PROTECTION_FAULT signal is a logical 1, the FET source control system 411 generates a current control signal iDAC_CODE that reduces the drain-to-source current $i_{DS}$ of the FET 306 and, thus, reduces the power dissipated by the FET 306. The amount of drain-to-source current $i_{DS}$ reduction and, thus, power dissipation reduction is a matter of design choice. In at least one embodiment, the FET source control system 411 reduces the drain-to-source current $i_{DS}$ to zero or to a value that is low enough to allow reduction of the power dissipated by the FET 306 without damaging the FET 306 due to prolonged overheating. The value of the PROTECTION_FAULT signal can also be utilized by the controller 405 to generate an indication of the status of the FET 306 for immediate and/or historical reference.

The comparator logic 516 determines when the modeled, estimated power dissipation of the decreases below the power recovery threshold $P_{RECOVERY}$. The value of the power protection threshold $P_{PROTECT}$ is a matter of design choice based on the operating limitations of the FET 306, which can generally be obtained from a data sheet of the manufacturer of the FET 306. In at least one embodiment, 1.2 W for a 110V RMS supply voltage from voltage supply 104 and 1.8 W for a 220V RMS supply voltage. The value of power recovery threshold $P_{RECOVERY}$ is also a matter of design choice and is, in at least one embodiment, 64 mW. In at least one embodiment, the values of power protection threshold $P_{PROTECT}$ and power recovery threshold $P_{RECOVERY}$ are programmable.

The comparator logic 516 provides a logical 1 output to an input of the OR logic gate 522 when the comparator logic 516 determines that the modeled, estimated power dissipation of the FET 306 is less than the power recovery threshold $P_{RECOVERY}$. A modeled, estimated power dissipation of the FET 306 less than the power recovery threshold $P_{RECOVERY}$ indicates that the temperature of the FET 306 has decreased sufficiently to resume normal operations. An ENABLE LATCH_TYPE PROTECTION value indicates whether the primary/fail-safe logic 502 utilizes the power recovery threshold $P_{RECOVERY}$ value to resume normal operations are the primary/fail-safe logic 502 utilizes another criteria to resume normal operations. In at least one embodiment, the ENABLE LATCH_TYPE PROTECTION value is programmable, and, if set to a logical 1, the primary/fail-safe logic 502 utilizes the power recovery threshold $P_{RECOVERY}$ value to resume normal operations. Otherwise, another criteria is used, such as restarting the primary/fail-safe logic 502 by toggling the power from OFF to ON to the controller 405. If the ENABLE LATCH_TYPE PROTECTION value is programmable is set to a logical 1, the output of the logical OR gate 522 tracks the output of the comparator logic 516, and PROTECTION_FAULT signal is reset to a logical 0 when the modeled, estimated power dissipation of the FET 306 decreases below the power recovery threshold $P_{RECOVERY}$. Once the PROTECTION_FAULT signal is reset to a logical 0, the FET source control system 411 resumes normal operation of the FET 306. The particular implementation of the FET protection system 500 is a matter of design choice. For example, the FET protection system 500 can be implemented utilizing logic blocks as shown and/or implemented using software stored in a non-transitory memory (not shown) of the controller 405 and executed by a processor (not shown) of the controller 405.

Figure 6:
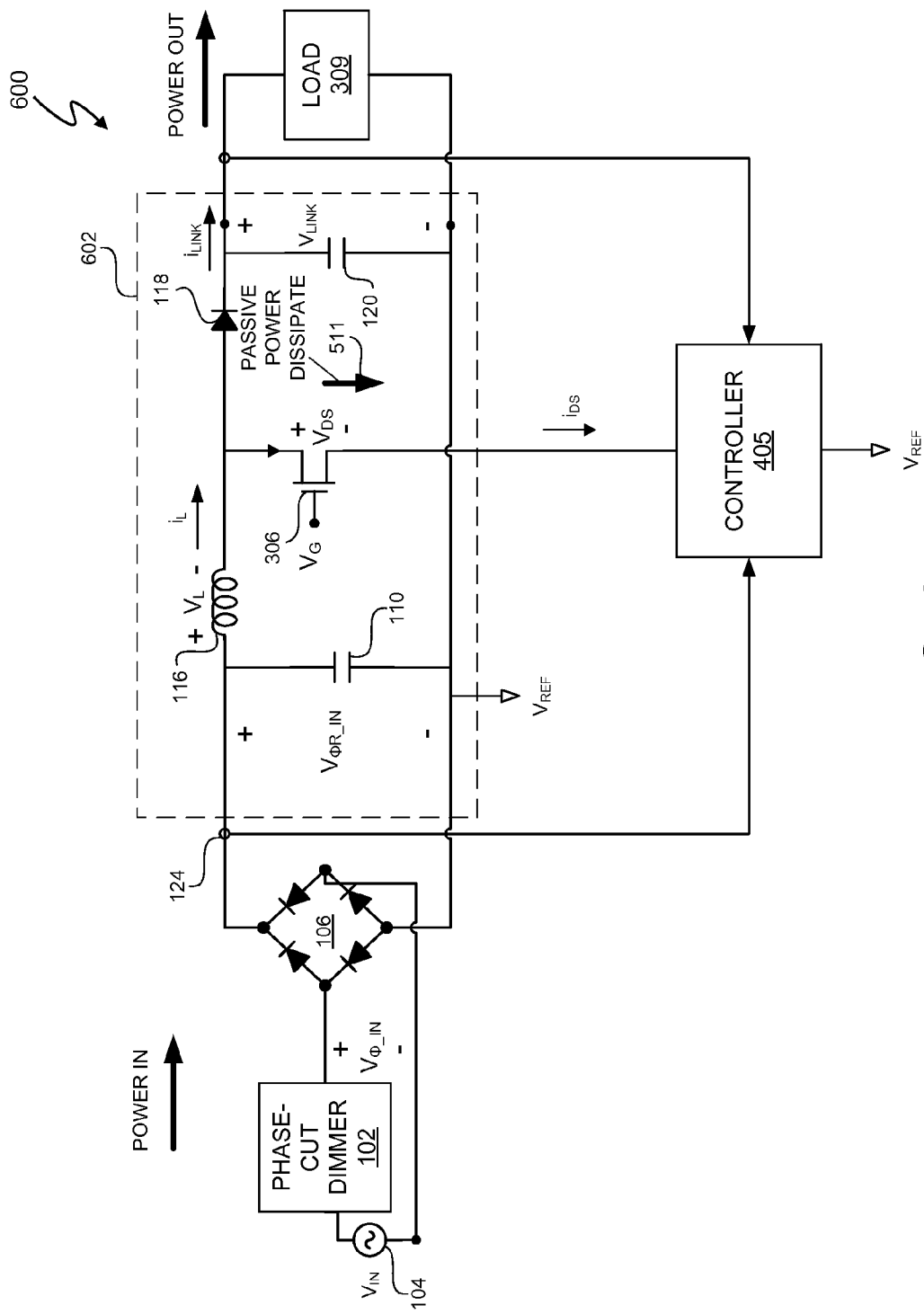
FIG. 6 depicts an embodiment of the electronic system of FIG. 4.

FIG. 6 depicts an electronic system 600, which represents one embodiment of the electronic system 400. The switching power converter 602 represents one embodiment of the circuitry 312. The switching power converter 602 operates as described in conjunction with switching power converter 108 with the exception that the FET 306 is source-controlled with a fixed gate bias voltage, and controller 405 operates as described with reference to FIGS. 3, 4, and 5.

Figure 7:
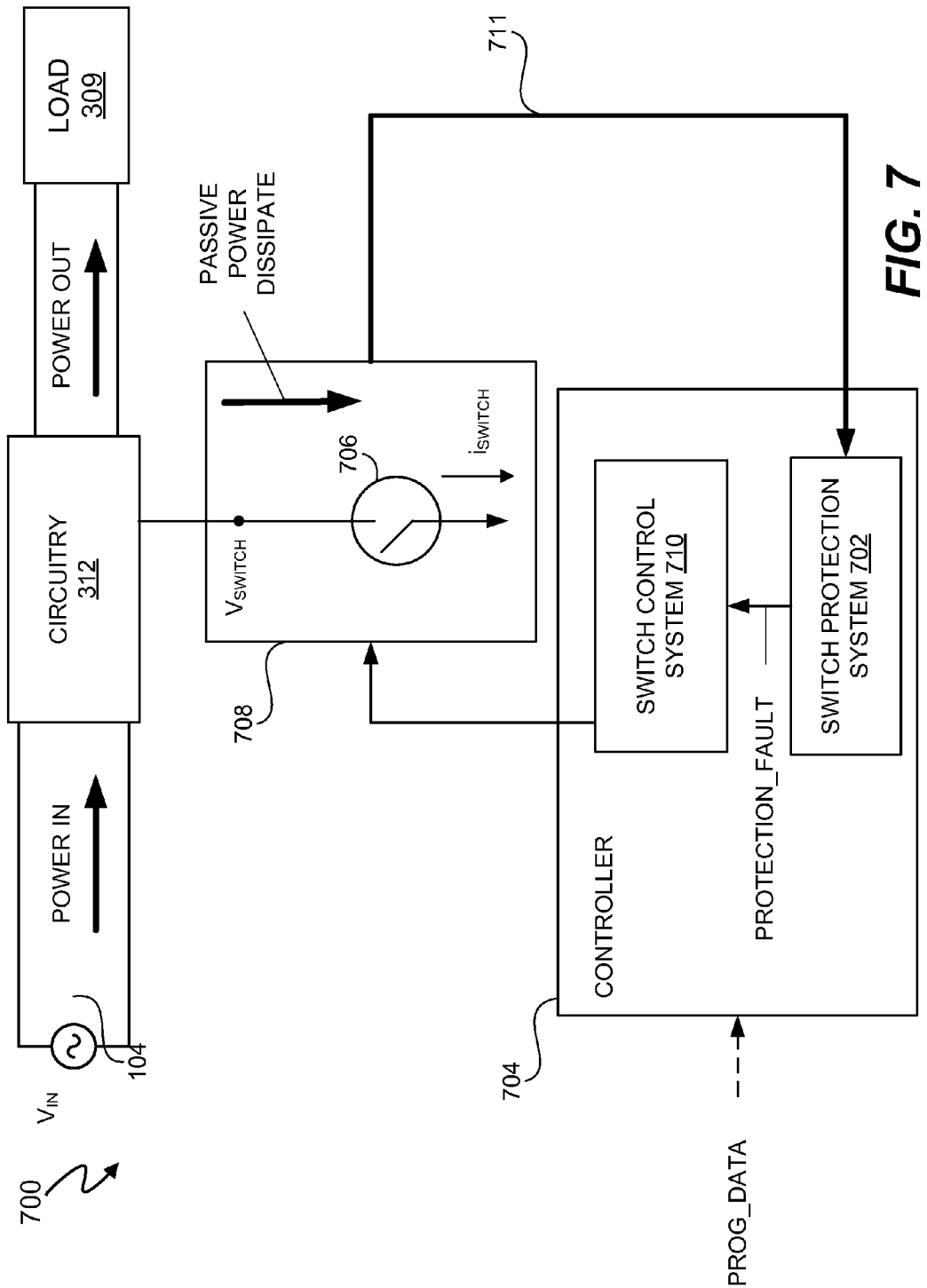
FIG. 7 depicts an electronic system that includes a generic switch protection system.

FIG. 7 depicts an electronic system 700 that includes a generic switch protection system 702. The foregoing discussion primarily discussed the protection of a source controlled FET 306. However, the principles discussed previously also apply to other types of switches and other types of switch controls. In FIG. 7, the controller 704 includes a switch protection system 702 that protects the switch 706 from excessive power dissipation and associated overheating. The switch 706 can be any type of switch, such as any type of FET or bipolar junction transistor (BJT). The parameter sensing path 711 senses one or more values associated with the switch 706 for use in estimating the power dissipated by the switch 706. For example, for a base controlled BJT, in at least one embodiment, the parameter sensing path 711 senses the collector voltage of the BJT and, in at least one embodiment, also senses the emitter voltage of the BJT for the fail-safe operations. The switch control system 710 controls conductivity of the switch 706 in any desired manner. For example, in addition to providing source control for a FET switch 706, the switch control system 710 can be configured to provide gate control of a FET switch 706 or base, collector, or emitter control for a BJT. In at least one embodiment, the switch control system 710 protects the switch 706 in the same manner as FET control system 411 (FIG. 4).

Figure 8:
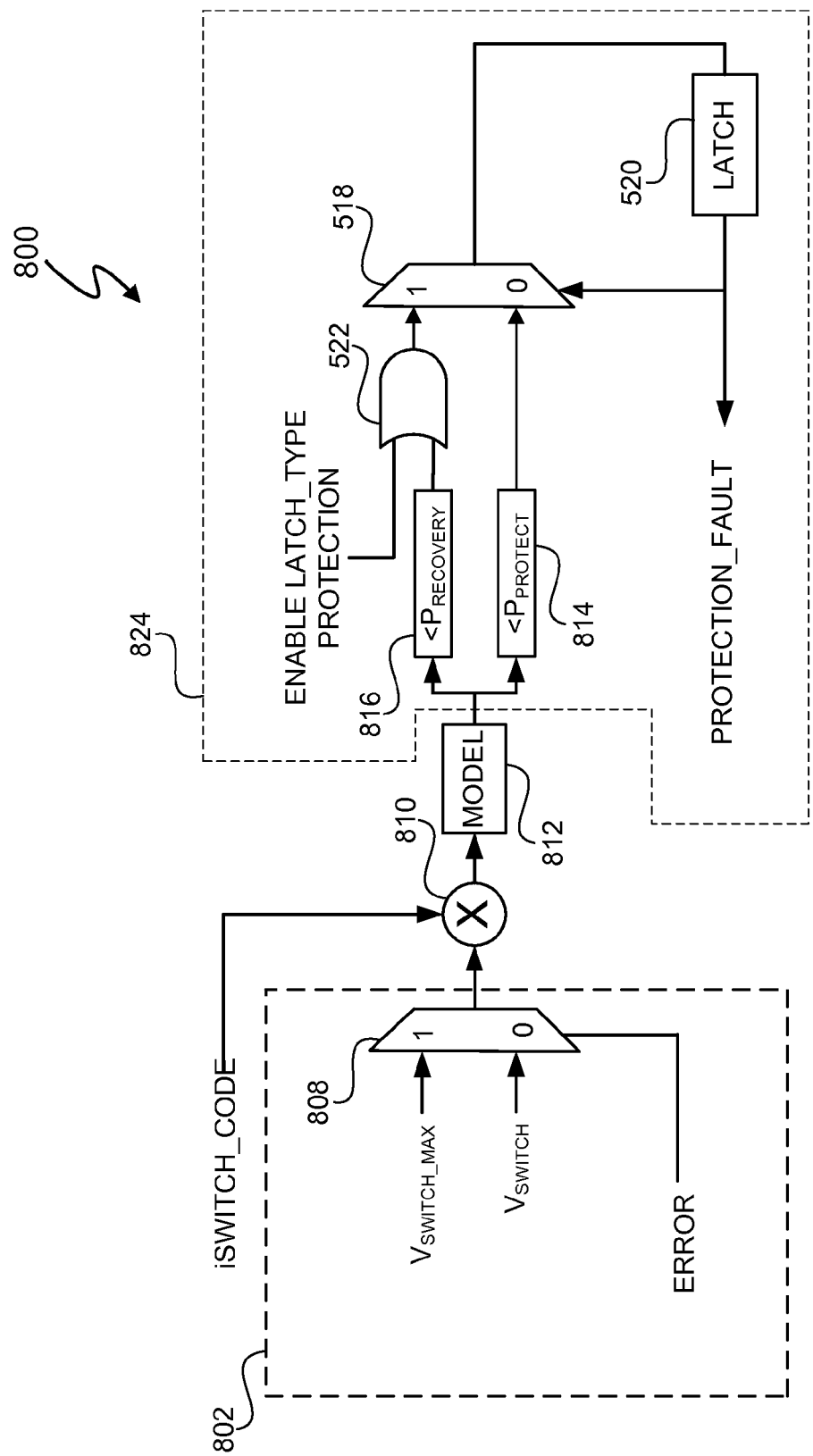
FIG. 8 depicts an embodiment of a switch protection system.

FIG. 8 depicts an embodiment of a switch protection system 800, which represents an embodiment of the switch protection system 702. Referring to FIGS. 7 and 8, similar to the primary/fail-safe logic 502, the primary/fail-safe logic 802 determines when to use the sampled switch voltage $V_{SWITCH}$ or a fail-safe voltage $V_{SWITCH\_MAX}$ to estimate the power dissipated by the switch 706. In at least one embodiment, the fail-safe voltage $V_{SWITCH\_MAX}$ represents a maximum expected voltage across the switch 706. The ERROR signal selects which of the two inputs, $V_{SWITCH}$ or $V_{SWITCH\_MAX}$, for the multiplexer 808 to provide to an input of the multiplier 810. The model 812 models the thermal characteristics of the switch 706 and, in at least one embodiment, is a low pass filter that has a rate of change time constant that models the thermal heating and cooling rate of change of the switch 706. The model 812 provides output data to the protection/recovery module 824. The power protection threshold $P_{PROTECT}$ logic 814 and power recovery threshold $P_{RECOVERY}$ logic 816 contain respective protection and recovery threshold values that are appropriate for the particular switch 706. The power protection threshold $P_{PROTECT}$ logic 814 and power recovery threshold $P_{RECOVERY}$ logic 816 function in the same manner as the respective power protection threshold $P_{PROTECT}$ logic 516 and power recovery threshold $P_{RECOVERY}$ logic 514 of FIG. 5. The remainder of the recovery enabling functions of AND logic 522, multiplexer 518, and the latch 520 to generate the PROTECTION_FAULT signal function as described in conjunction with the FET protection system 500.

Figure 9:
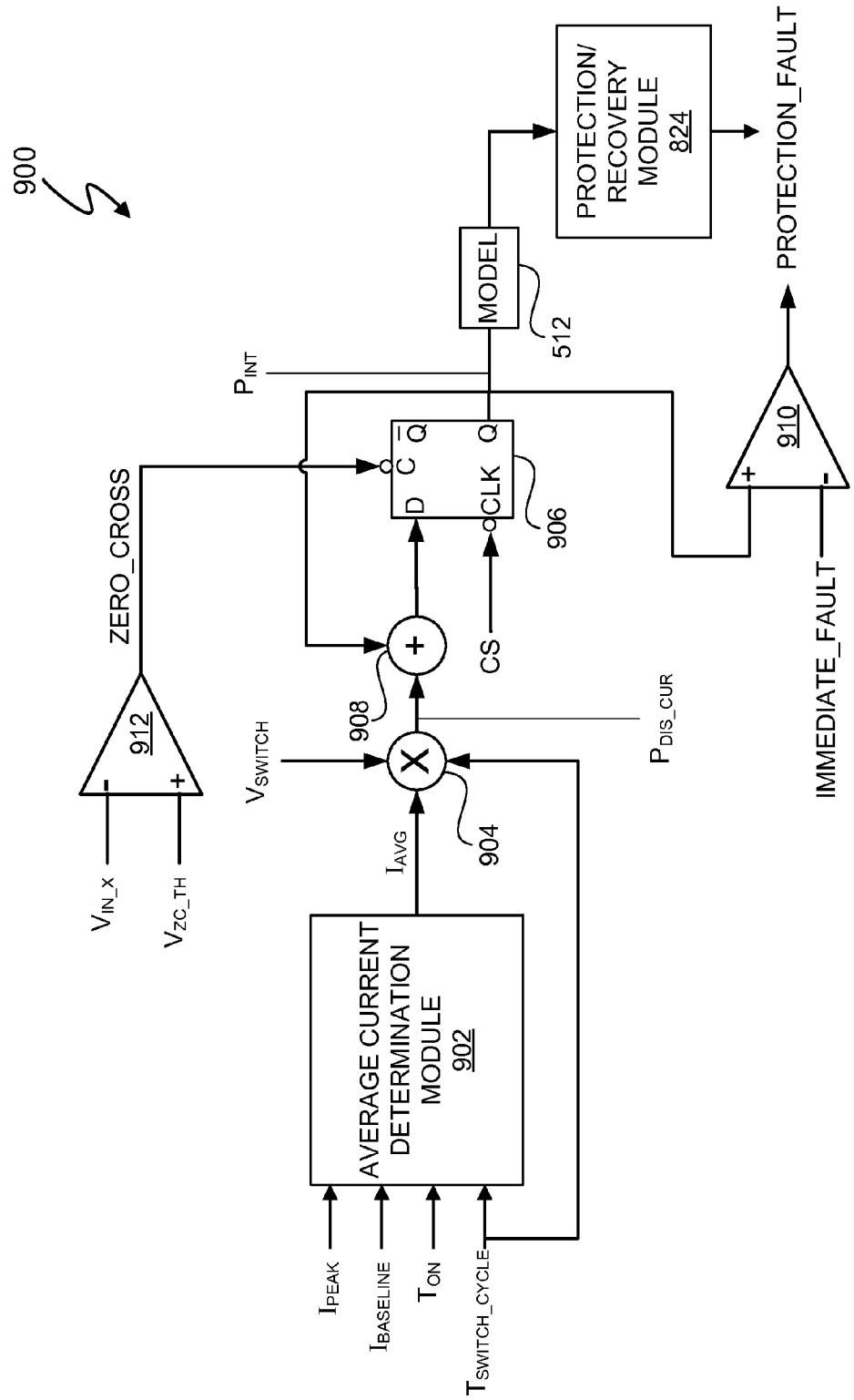
FIG. 9 depicts a further embodiment of a switch protection system.

FIG. 9 depicts a multi-time switch protection system 900, which represents one embodiment of the switch protection system 702. Referring to FIGS. 7 and 9, in general, the switch protection system 900 provides an immediate fault and a longer term fault to protect the switch 706 in the event of a significant increase in power dissipation during a cycle of the input voltage $V_{IN}$ and a trending rise in power dissipation. In at least one embodiment, the switch control system 710 controls the conductivity of the switch 706 by turning the switch 706 OFF and ON, which controls the average switch current $i_{SWITCH}$. In at least one embodiment, the switching frequency is significantly higher than the frequency of the input voltage $V_{IN}$. In at least one embodiment, the switching frequency is any value within the range of 20 kHz-100 kHz. The average current determination module 902 determines an average value of the current $i_{SWITCH}$ through the switch 706. In at least one embodiment, during each cycle of the switch current $i_{SWITCH}$, the switch current $i_{SWITCH}$ linearly rises from a baseline current value $i_{BASELINE}$ to a peak value $I_{PEAK}$, and then linearly returns back to the baseline current value $i_{BASELINE}$. Thus, in at least one embodiment, the profile of the switch current $i_{SWITCH}$ is essentially in the shape of a right triangle, and, in this embodiment, Equation 2 represents the average value of the switch current $i_{SWITCH}$ during each cycle of the switch 706:

$$I_{AVG} = \frac{\frac{1}{2}(I_{PEAK} - I_{BASELINE}) \times T_{ON}}{T_{SWITCH\_CYCLE}} + I_{BASELINE} \qquad \text{Equation 2}$$

where $I_{AVG}$ is the average value of the switch current $i_{SWITCH}$, $I_{PEAK}$ is a peak value of the switch current $i_{SWITCH}$ during a cycle of the switch 706, $I_{BASELINE}$ is a starting value of the switch current $i_{SWITCH}$ during a cycle of the switch 706, $T_{ON}$ is the period during which the switch 706 conducts for a cycle of the switch 706, and $T_{SWITCH\_CYCLE}$ is the time period from when the switch 706 conducts to the next time that the switch 706 conducts.

Figure 1:
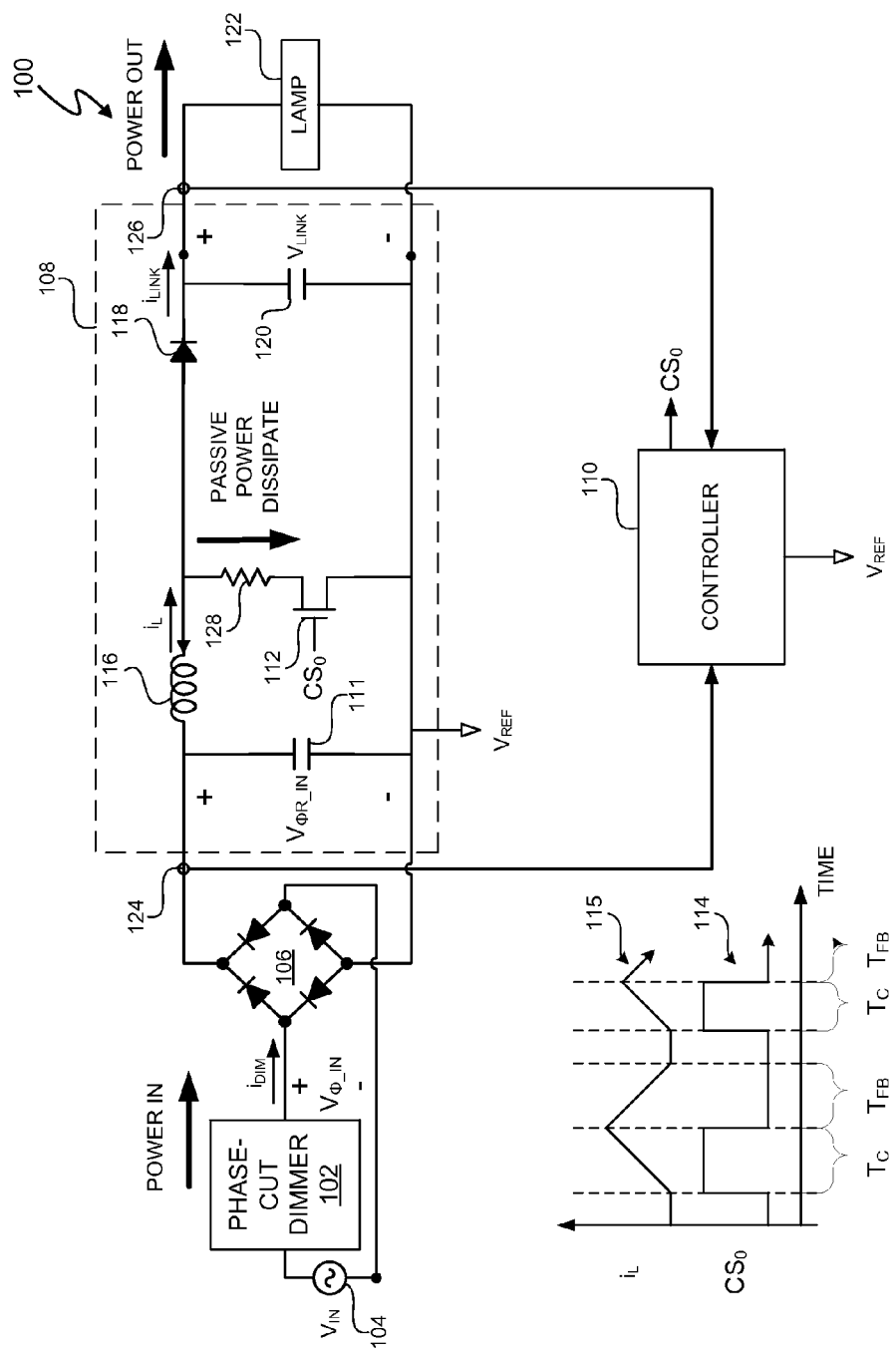
FIG. 1 (labeled prior art) depicts a lighting system that includes a leading edge dimmer.
Figure 2:
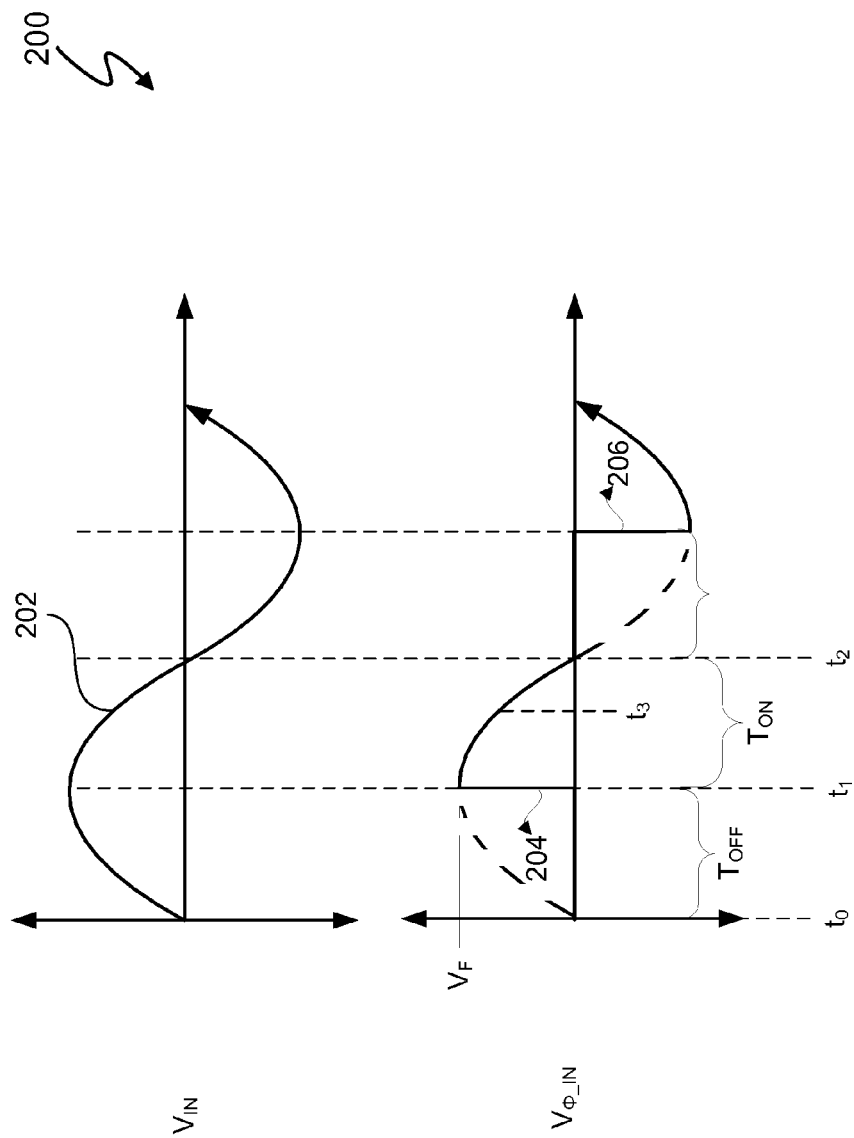
FIG. 2 (labeled prior art) depicts exemplary voltage graphs associated with the lighting system of FIG. 1.

The multiplier 904 multiplies the per switch cycle average switch current $I_{avg}$, the switch voltage $V_{SWITCH}$, and the $T_{SWITCH\_CYCLE}$ to obtain a current, estimated power dissipation value $P_{DIS\_CUR}$ for the switch 706. The control signal CS is a pulse width modulated signal, and the pulse of the control signal CS represents the ON time of the switch 706. In at least one embodiment, the control signal CS is functionally similar to the control signal $CS_0$ of FIG. 1. The D-flip-flop latch 906 and summer 908 form an integrator that updates a per-switch-cycle estimated switch power dissipation value $P_{INT}$ each cycle of the switch 706 based on the pulse of the control signal CS. The comparator 910 compares the per-switch-cycle estimated switch power dissipation value $P_{INT}$ to a predetermined IMMEDIATE_FAULT signal. The particular value of the IMMEDIATE_FAULT is a matter of design choice and, in at least one embodiment, depends on manufacturer data for the switch 706 that specifies power dissipation limits. For example, in at least one embodiment, the IMMEDIATE_FAULT is greater than 2 W. If the comparator 910 determines that the per-switch-cycle estimated switch power dissipation value $P_{INT}$ is greater than the IMMEDIATE_FAULT value, then the comparator 910 changes the state of the PROTECTION_FAULT value so that switch control system 710 will protect the switch 706. The ZERO_CROSS signal clears and resets the D-flip-flop for each cycle of the input voltage $V_{IN}$. The ZERO_CROSS signal represents the period of the input voltage $V_{IN}$. The voltage value $V_{IN\_X}$ is an input to the inverting node of the comparator 912 and represents a rectified version of the input voltage $V_{IN}$ or a rectified, phase-cut version of the input voltage $V_{IN}$. In at least one embodiment, the input voltage $V_{IN}$ is periodic sine wave, and, thus, each time the input voltage $V_{IN}$ reaches a zero crossing represents a half-cycle of the input voltage $V_{IN}$. The non-inverting node of the comparator 912 receives a zero crossing threshold value $V_{ZC\_TH}$, which, in at least one embodiment, is 0V or approximately 0V. Accordingly, when the voltage value $V_{IN\_X}$ falls below the zero crossing threshold value $V_{ZC\_TH}$, the ZERO_CROSS signal changes states and resets the D-flip-flop 906 for the next half cycle of the input voltage $V_{IN}$. The model 512 and protection/recovery module 824 function as previously described to generate the PROTECTION_FAULT signal.

The particular implementation of the switch protection system 900 is a matter of design choice. For example, the switch protection system 900 can be implemented utilizing logic blocks as shown and/or implemented using software stored in a non-transitory memory (not shown) of the controller 704 and executed by a processor (not shown) of the controller 704.

Thus, a system and method include a controller that reduces power dissipated by a switch when an estimated amount of power dissipated by the switch exceeds a predetermined threshold. Reducing the power dissipated by the switch prevents damage to the switch due to thermal effects of overheating.

Although embodiments have been described in detail, it should be understood that various changes, substitutions, and alterations can be made hereto without departing from the spirit and scope of the invention as defined by the appended claims.

What is claimed is:

1. A method comprising:
controlling conductivity of a switch;
estimating an amount of power dissipated by the switch;
determining if the estimated power dissipated by the switch exceeds a first predetermined threshold value; and
reducing the power dissipated by the switch when the estimated power dissipated by the switch exceeds the first predetermined threshold value.

2. The method of claim 1 further comprising:
evaluating a fail-safe protection path to determine an efficacy of the determination of the estimated power dissipated by the switch using the first voltage and a current through the switch.

3. The method of claim 2 further comprising:
filtering the determined estimated power dissipated by the switch using a filter that models a thermal heating and cooling time constant of the switch to determine a modeled estimated power dissipation by the switch.

4. The method of claim 3 further comprising:
determining if the modeled estimated power dissipation by the switch is greater than a power dissipation protection threshold; and
reducing the power dissipated by the switch if the modeled estimated power dissipation by the switch is greater than a first power dissipation threshold.

5. The method of claim 4 wherein reducing the power dissipated by the switch comprises preventing the switch from operating, the method further comprising:
enabling restoration of operation of the switch;
determining if the modeled estimated power dissipation by the switch is less than a recovery power dissipation threshold; and
restoring operation of the switch when the modeled estimated power dissipation by the switch is less than the recovery power dissipation threshold.

6. The method of claim 5 wherein reducing the power dissipated by the switch comprises preventing the switch from operating until a circuit controlled by the switch restarts.

7. The method of claim 1 wherein the switch comprises a field effect transistor (FET) and controlling a conductivity of a switch controlling a source of the FET to control conductivity of the FET.

8. The method of claim 7 wherein the FET includes a drain and controlling a source of a field effect transistor (FET) to control conductivity of the FET comprises controlling a drain-to-source current through the FET, the method further comprising:
determining the estimated power dissipated by the FET using a first voltage and the drain-to-source current.

9. The method of claim 8 wherein the first voltage is a voltage at the drain of the FET.

10. The method of claim 8 further comprising:
evaluating a fail-safe protection path to determine an efficacy of the determination of the estimated power dissipated by the FET using the first voltage and the drain-to-source current.

11. The method of claim 10 wherein evaluating the fail-safe protection path further comprises:
sensing a voltage at the source of the FET;
comparing the voltage at a drain of the FET to a first threshold voltage;
comparing the voltage at the source of the FET to a second threshold voltage; and
if the voltage at the drain of the FET is less than the first threshold voltage and the voltage at the source of the FET is greater than the second threshold voltage drain, then determining the estimated power dissipated by the FET using a first voltage and the drain-to-source current comprises:
determining the estimated power dissipated by the FET using a first voltage and the drain-to-source current, wherein the first voltage is an estimated maximum peak voltage at the drain of the FET.

12. The method of claim 11 wherein the first threshold voltage comprises a voltage within a range of about 10%-20% of a peak value of the voltage at the drain of the FET and the second threshold voltage comprises a voltage within a range of 3-6 volts.

13. The method of claim 2 further comprising:
filtering the determined estimated power dissipated by the FET using a filter that models a thermal heating and cooling time constant of the FET to determine a modeled estimated power dissipation by the FET.

14. The method of claim 13 further comprising:
determining if the modeled estimated power dissipation by the FET is greater than a power dissipation protection threshold; and
reducing the power dissipated by the FET if the modeled estimated power dissipation by the FET is greater than a first power dissipation threshold.

15. The method of claim 14 wherein reducing the power dissipated by the FET comprises preventing the FET from operating, the method further comprising:
enabling restoration of operation of the FET;

determining if the modeled estimated power dissipation by the FET is less than a recovery power dissipation threshold; and restoring operation of the FET when the modeled estimated power dissipation by the FET is less than the recovery power dissipation threshold.

16. The method of claim 14 wherein reducing the power dissipated by the FET comprises preventing the FET from operating until a circuit controlled by the FET restarts.

17. The method of claim 13 wherein the filter comprises a low pass filter.

18. The method of claim 17 wherein the filter comprises an infinite impulse response filter having a time constant that approximates the thermal heating and cooling characteristics of the FET.

19. The method of claim 1 wherein controlling the source of the FET to control conductivity of the FET controls operation of a switching power converter.

20. The method of claim 1 wherein the switch is a member of a group consisting of a bipolar junction transistor and a field effect transistor.

21. The method of claim 1 wherein controlling a conductivity of a switch comprises generating a control signal to control the conductivity of the switch, and the switch is coupled to a periodic input voltage source, the method further comprising:

for each cycle of the control signal, determining if the estimated power dissipated by the FET exceeds a second predetermined threshold value;

reducing the power dissipated by the FET when the estimated power dissipated by the FET exceeds the second predetermined threshold value; and for each cycle of the input voltage:
determining if the estimated power dissipated by the FET exceeds a first predetermined threshold value; and reducing the power dissipated by the FET when the estimated power dissipated by the FET exceeds the first predetermined threshold value.

22. The method of claim 1 further comprising:
controlling the conductivity of the switch to control power conversion by a switching power converter.

23. An apparatus comprising:
a controller, wherein the controller is configured to:
control conductivity of a switch;
estimate an amount of power dissipated by the switch;
determine if the estimated power dissipated by the switch exceeds a first predetermined threshold value; and
reduce the power dissipated by the switch when the estimated power dissipated by the switch exceeds the first predetermined threshold value.

24. The apparatus of claim 1 wherein the controller is further configured to:
evaluate a fail-safe protection path to determine an efficacy of the determination of the estimated power dissipated by the switch using the first voltage and a current through the switch.

25. The apparatus of claim 2 further comprising:
a filter to filter the determined estimated power dissipated by the switch using a filter that models a thermal heating and cooling time constant of the switch to determine a modeled estimated power dissipation by the switch.

26. The apparatus of claim 3 wherein the controller is further configured to:
determine if the modeled estimated power dissipation by the switch is greater than a power dissipation protection threshold; and
reduce the power dissipated by the switch if the modeled estimated power dissipation by the switch is greater than a first power dissipation threshold.

27. The apparatus of claim 4 wherein to reduce the power dissipated by the switch comprises preventing the switch from operating, and the controller is further configured to:
enable restoration of operation of the switch;
determine if the modeled estimated power dissipation by the switch is less than a recovery power dissipation threshold; and
restore operation of the switch when the modeled estimated power dissipation by the switch is less than the recovery power dissipation threshold.

28. The apparatus of claim 5 wherein to reduce the power dissipated by the switch, the controller is further configured to prevent the switch from operating until a circuit controlled by the switch restarts.

29. The apparatus of claim 23 wherein the switch comprises a field effect transistor (FET) and controlling a conductivity of a switch controlling a source of the FET to control conductivity of the FET.

30. The apparatus of claim 24 wherein the FET includes a drain and controlling a source of a field effect transistor (FET) to control conductivity of the FET comprises controlling a drain-to-source current through the FET, and the controller is further configured to:
determine the estimated power dissipated by the FET using a first voltage and the drain-to-source current.

31. The apparatus of claim 30 wherein the first voltage is a voltage at the drain of the FET.

32. The apparatus of claim 30 wherein the controller is further configured to:
evaluate a fail-safe protection path to determine an efficacy of the determination of the estimated power dissipated by the FET using the first voltage and the drain-to-source current.

33. The apparatus of claim 32 wherein to evaluate the fail-safe protection path the controller is further configured to:
sense a voltage at the source of the FET;
compare the voltage at a drain of the FET to a first threshold voltage;
compare the voltage at the source of the FET to a second threshold voltage; and
if the voltage at the drain of the FET is less than the first threshold voltage and the voltage at the source of the FET is greater than the second threshold voltage drain, then to determine the estimated power dissipated by the FET using a first voltage and the drain-to-source current the controller is further configured to:
determine the estimated power dissipated by the FET using a first voltage and the drain-to-source current, wherein the first voltage is an estimated maximum peak voltage at the drain of the FET.

34. The apparatus of claim 33 wherein the first threshold voltage comprises a voltage within a range of about 10%-20% of a peak value of the voltage at the drain of the FET and the second threshold voltage comprises a voltage within a range of 3-6 volts.

35. The apparatus of claim 24 wherein the controller is further configured to:
  filter the determined estimated power dissipated by the FET using a filter that models a thermal heating and cooling time constant of the FET to determine a modeled estimated power dissipation by the FET.

36. The apparatus of claim 35 wherein the controller is further configured to:
  determine if the modeled estimated power dissipation by the FET is greater than a power dissipation protection threshold; and
  reduce the power dissipated by the FET if the modeled estimated power dissipation by the FET is greater than a first power dissipation threshold.

37. The apparatus of claim 36 wherein to reduce the power dissipated by the FET comprises preventing the FET from operating, the controller is further configured to:
  enable restoration of operation of the FET;
  determine if the modeled estimated power dissipation by the FET is less than a recovery power dissipation threshold; and
  restore operation of the FET when the modeled estimated power dissipation by the FET is less than the recovery power dissipation threshold.

38. The apparatus of claim 36 wherein to reduce the power dissipated by the FET the controller is further configured to prevent the FET from operating until a circuit controlled by the FET restarts.

39. The apparatus of claim 35 wherein the filter comprises a low pass filter.

40. The apparatus of claim 39 wherein the filter comprises an infinite impulse response filter having a time constant that approximates the thermal heating and cooling characteristics of the FET.

41. The apparatus of claim 23 wherein to control the source of the FET to control conductivity of the FET allows the controller to control operation of a switching power converter.

42. The apparatus of claim 23 wherein the switch is a member of a group consisting of a bipolar junction transistor and a field effect transistor.

43. The apparatus of claim 23 wherein to control a conductivity of a switch comprises generating a control signal to control the conductivity of the switch, and the switch is coupled to a periodic input voltage source, the controller is further configured to:
  for each cycle of the control signal, determine if the estimated power dissipated by the FET exceeds a second predetermined threshold value;
  reduce the power dissipated by the FET when the estimated power dissipated by the FET exceeds the second predetermined threshold value; and
  for each cycle of the input voltage:
    determine if the estimated power dissipated by the FET exceeds a first predetermined threshold value; and
    reduce the power dissipated by the FET when the estimated power dissipated by the FET exceeds the first predetermined threshold value.

44. The apparatus of claim 23 wherein the controller is further configured to:
  control the conductivity of the switch to control power conversion by a switching power converter.

45. The apparatus of claim 23 wherein the controller comprises an integrated circuit.

46. An apparatus comprising:
  a switching power converter having a switch whose conductivity controls power conversion by the switching power converter;
  a load coupled to the switching power converter; and
  a controller, coupled to the switching power converter, wherein the controller is configured to:
  control conductivity of the switch;
  estimate an amount of power dissipated by the switch;
  determine if the estimated power dissipated by the switch exceeds a first predetermined threshold value; and
  reduce the power dissipated by the switch when the estimated power dissipated by the switch exceeds the first predetermined threshold value.

47. The apparatus of claim 46 wherein the load comprises one or more light emitting diodes.

* * * * *